(12) United States Patent
Slesinger

(10) Patent No.: US 6,633,663 B1
(45) Date of Patent: Oct. 14, 2003

(54) METHOD AND SYSTEM FOR DETERMINING COMPONENT DIMENSIONAL INFORMATION

(75) Inventor: Kris A. Slesinger, Charlotte, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/072,498

(22) Filed: May 5, 1998

(51) Int. Cl.[7] .................................................. G06K 9/00

(52) U.S. Cl. ........................ 382/147; 382/147; 382/199; 382/291

(58) Field of Search ................................ 382/141, 143, 382/145, 151, 147, 152, 153, 199, 201, 266, 286, 288, 291; 250/237.4; 356/12, 614

(56) References Cited

U.S. PATENT DOCUMENTS

| | | | |
|---|---|---|---|
| 4,212,031 A | | 7/1980 | Schmitt et al. ............. 358/101 |
| 4,628,464 A | * | 12/1986 | McConnell ................. 382/153 |
| 4,688,939 A | * | 8/1987 | Ray ............................ 356/237 |
| 4,737,845 A | | 4/1988 | Susuki et al. ............... 358/101 |
| 4,759,073 A | | 7/1988 | Shah et al. ..................... 382/8 |
| 4,809,308 A | * | 2/1989 | Adams et al. .............. 378/901 |
| 4,847,911 A | * | 7/1989 | Morimoto et al. .......... 358/106 |
| 4,881,863 A | * | 11/1989 | Braginsky ................... 209/546 |
| 5,038,380 A | | 8/1991 | Morimoto et al. ............. 382/8 |
| RE33,974 E | * | 6/1992 | Asai et al. ...................... 16/44 |
| 5,131,753 A | * | 7/1992 | Pine et al. ................... 356/615 |
| 5,157,734 A | | 10/1992 | Chen et al. ..................... 382/8 |
| 5,164,994 A | * | 11/1992 | Bushroe ....................... 382/150 |
| 5,371,690 A | * | 12/1994 | Engel et al. ................. 382/151 |
| 5,434,802 A | | 7/1995 | Matsumoto .................. 364/559 |
| 5,465,152 A | | 11/1995 | Bilodeau et al. ............. 356/371 |
| 5,491,888 A | * | 2/1996 | Sakurai et al. ................. 29/832 |
| 5,541,834 A | | 7/1996 | Tomigashi et al. ..... 364/167.01 |
| 5,561,696 A | * | 10/1996 | Adams et al. ................. 378/58 |

(List continued on next page.)

OTHER PUBLICATIONS

AdoptVision Reference Guide, Version 10.0, Mar. 1990; Chapter 1 (Introduction).
AdoptVision Reference Guide, Version 10.0, Mar. 1990; Chapter 6 (Vision Programming).
AdoptVision Reference Guide, Version 10.0, Mar. 1990; Chapter 7 (Descriptions of Vision Keywords).
VisionWare User's Guide, Adept, Chapter 12, Vision Basics, pp. 166–172, including Appendix C—Special and Model Records, pp. 204–207.
VisionWare User's Guide, Adept, Table 3–3; Section 3.4; pp 46–49; and Section 5.5; pp. 71–76, Section 7, pp. 98–1–3.
AIM Vision/Vision Ware Module, Reference Guide, Adept, pp. 4–13–4–14; 8–55–8–59.

Primary Examiner—Jayanti K. Patel
Assistant Examiner—Sheela Chawen
(74) Attorney, Agent, or Firm—Connolly, Bove, Lodge & Hutz LLP

(57) ABSTRACT

A method and system for determining component dimensional information in a component placement system. The component information is derived from the pick and place equipment which is used to place the components on the substrate. The component is grasped at substantially the centroid position and moved over the aperture of a camera. The edges of the component are located, and from the edges an accurate location of the centroid may be obtained. The centroid, as well as the length, width and thickness of the component is stored in a database for use during placing of the component. Other features derived include orientation indicia obtained from component features which are viewed by the camera. During placement, all features associated with the component necessary to accurately locate the component on a substrate are obtained from the database.

9 Claims, 9 Drawing Sheets

U.S. PATENT DOCUMENTS

| | | | |
|---|---|---|---|
| 5,608,642 A | * 3/1997 | Onodera | 700/213 |
| 5,652,658 A | 7/1997 | Jackson et al. | 356/398 |
| 5,741,114 A | * 4/1998 | Onodera | 414/783 |
| 5,760,893 A | * 6/1998 | Raymond | 356/394 |
| 5,768,759 A | * 6/1998 | Hudson | 29/407.04 |
| 5,825,914 A | * 10/1998 | Tsuboi et al. | 382/141 |
| 5,872,863 A | * 2/1999 | Tsuboi et al. | 382/151 |
| 5,911,001 A | * 6/1999 | Kawada | 382/209 |
| 5,956,149 A | * 9/1999 | Suzuki et al. | 356/375 |
| 5,974,169 A | * 10/1999 | Bachelder | 382/151 |
| 6,118,538 A | * 9/2000 | Haugan et al. | 250/559.34 |
| 6,195,618 B1 | * 2/2001 | Rosenberg et al. | 702/152 |
| 6,292,261 B1 | * 9/2001 | Fishbaine et al. | 250/559.29 |

* cited by examiner

METHOD AND SYSTEM FOR DETERMINING COMPONENT DIMENSIONAL INFORMATION

BACKGROUND OF THE INVENTION

The present invention relates to automated systems for mounting electronic components to various carriers. Specifically, a system and method are described which can determine component dimensional data and store the data for use in an automated attachment tooling process.

The process of manufacturing electronic circuits on a volume basis has been significantly automated. As part of the automation process, components are mechanically and/or optically measured, and under control of a computer, placed on a ceramic substrate or printed circuit board for permanent attachment. These systems employ a robotic positioning system for grasping and then locating a component with respect to a substrate or printed circuit board, and include a machine vision capability to identify various features on the component. When using these devices in accordance with the prior art, the user enters the various dimensional information about a component in a database of the vision machine. Based on the stored information, the component is selected and visualized during placement by a machine having vision capabilities. Actual component features are compared with the stored dimensional data to determine the appropriate placement position and orientation of the component.

One such system for placing components such as flip chips on a substrate is the Adept Vision AGS System. The system includes a mechanical positioning device, as well as a vision system which generates a plurality of images from a 640×480 pixel CCD sensor array. During positioning of a component for placement on a circuit board or ceramic substrate, the individual components are viewed and dimensional information is automatically derived from the images of the components to determine their correct orientation and placement on the substrate.

These prior art "pick and place" systems rely upon the operator entering information about each component being observed in a database. The effort in verifying the various dimensional characteristics of the components which are to be entered in the database is tedious and prone to error. Further, the component manufacturing tolerances from component to component result in certain inaccuracies being present in the data entered in the database. These errors can produce placement errors when the components have dimensional characteristics different from those stored in the database.

The foregoing problems are exacerbated by the trend in the electronics industry toward array technology where components having an increasingly high pinout are placed in even smaller packages. An increase in pinout necessarily increases the dimensional information which must be inserted in the pick and place equipment for accurate location of the components. These include packages which support a solder bump array for making internal connections, chip scale packages, and flip chip devices for mounting on a circuit board.

SUMMARY OF THE INVENTION

It is an object of this invention to reliably determine dimensional information of a component being placed on a circuit board.

It is a more specific object of this invention to provide for optical measurement of component dimensional information, and for storing the information in a database for use during a pick and place operation.

These and other objects of the invention are provided for by a method and system in accordance with the invention. An automated pick and place system provides a component dimensioning operation which visually inspects each component to be mounted, and builds a database containing the component dimensional information.

Among the dimensional information obtained is the location of the component centroid which are stored in the database for use during part placement, and registration features of the component. Registration features provide an indication of component orientation and are used along with the centroid location for component placement. The registration features may be selected based on any number of user priorities, including maximum placement accuracy, maximum throughput, or a blend of accuracy and throughput maximization.

DESCRIPTION OF THE PREFERRED EMBODIMENT

Figure 1:
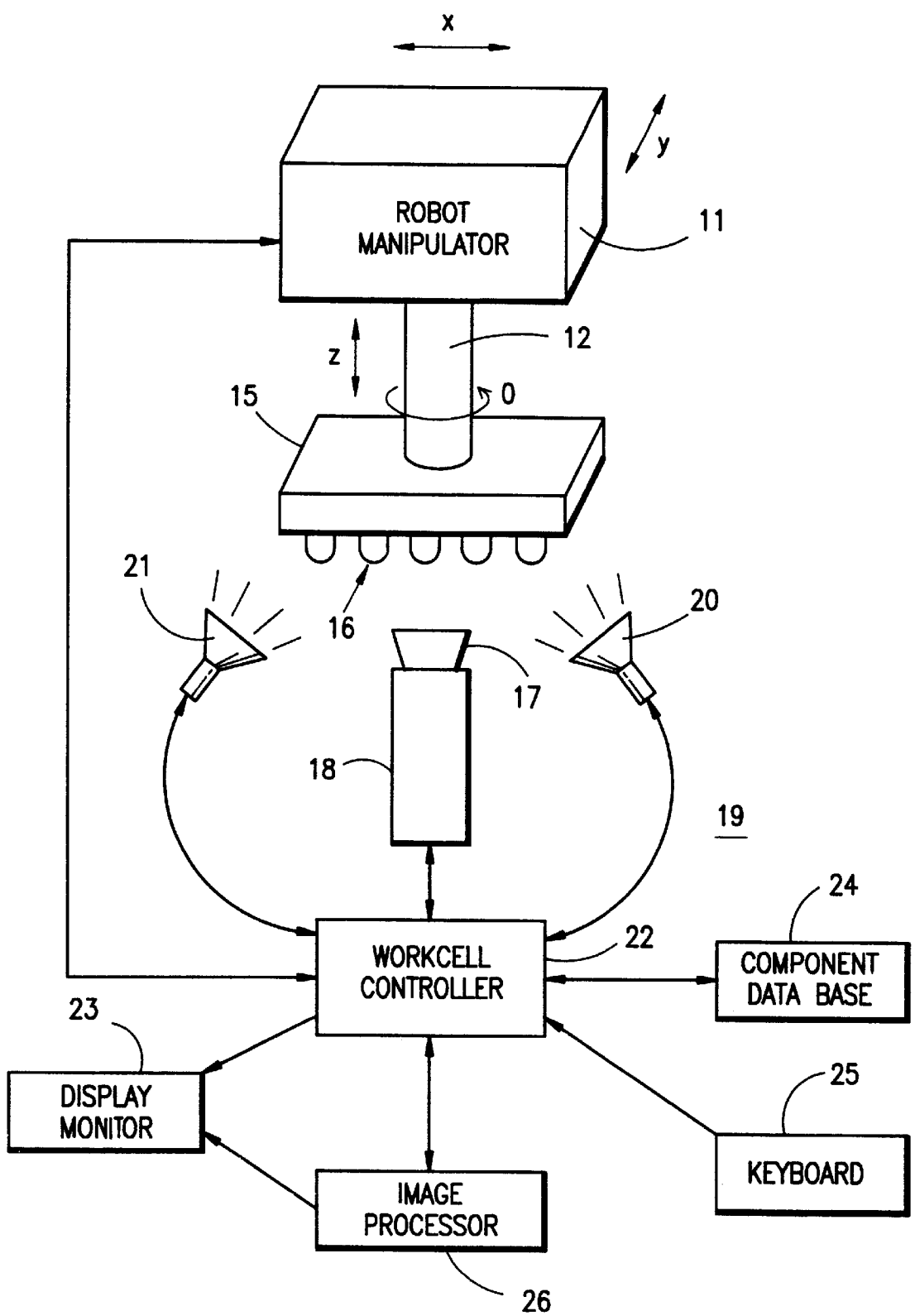
FIG. 1 is a block diagram of conventional pick and place automated equipment.

Referring now to FIG. 1, there is shown an automated pick and place system for locating components 15 on a circuit board or substrate. The equipment includes a robotic manipulator 11 having a vacuum quill 12 for grasping a component 15. The robotic manipulator 11 moves the component 15 in four dimensions, X, Y, Z and theta (rotation about the Z axis), under control of a work cell controller 22. The robotic manipulator will position the component 15 in the location for placement and orient the component 15 in accordance with information contained in the component database 24.

The pick and place equipment includes a machine vision system 19 in accordance with the preferred embodiment of the invention including a camera 18 having an aperture lens 17 such as the foregoing Adept Vision AGS System which is modified in accordance with the preferred embodiment. The camera 18 is a solid state rectangular CCD sensor array, which can provide an image frame of 640×480 pixels. In response to a command from the work cell controller 22, the camera will produce an image frame of pixels which are stored as binary data in an image buffer image processor 26, of each pixel having a binary value representing the grey scale of a point on an image.

Lighting is produced from lights 20, 21 under control of the work cell controller 22, to provide a specified level of grey scale ranges. The work cell controller is a personal computer which communicates which both the vision system, including an image processor 26 and component database 24, as well as the robotic manipulator 15. Operation of the work cell controller 22 is through the keyboard 25 and display monitor 23.

The vision system of FIG. 1 is capable of extracting boundaries and picture detail within an image frame stored in the image processor 26. Boundaries are extracted from the image by applying a gradient based edge operator to the image, and thresholding pixels into black and white regions. Pixels which are on either side of a specified grey scale level are determined to be either white or black, producing a binary image.

Once the boundaries have been determined, the vision system software, as described in the Adept Vision Reference Guide and related documents supplied with the Adept Vision AGS System, characterizes them as either connected sequences of straight lines or circular arcs. Once the characterization of the image features has been made, a determination is made in the work cell controller 22, whether the image contains connection structures such as solder balls, or holes within the surface of the component 15.

The preexisting AGS system software running in the work cell controller 22 determines distances between edges of the component, counts edge points for grey scale levels within windows of various shapes, as well as determines lines and arcs related to the respective edges. A component database 24 stores data which is used by the work cell controller 22 to locate components 15 which have been recognized by the system.

During a calibration phase for the vision system 19, each image pixel is calibrated to represent an actual size of a component detail. A calibration system determines a scale factor, representing the number of pixels per inch of a viewed component surface. The calibration process for the prior art system also determines the positional relationship between the robotic manipulator 11 and the vision system 19. The component positions within the image are converted to the robot coordinate system. Thus, movement of the vacuum quill 12 by the work cell controller 22 occurs in a known relationship with respect to observed movement in the image produced by the camera 18.

The present invention makes use of the foregoing pick and place equipment to map various features of components, and store the identified features and dimensions in a component database 24. This avoids the limitations of manually measuring component dimensions, selecting features of the component for orientation, and placing the information in a component database 24 by data entry through keyboard 25. In accordance with the present invention, the equipment is used to identify all of the pertinent dimensional information of component 15 and add this information to the component database 24 with minimal operator intervention.

Figure 2:
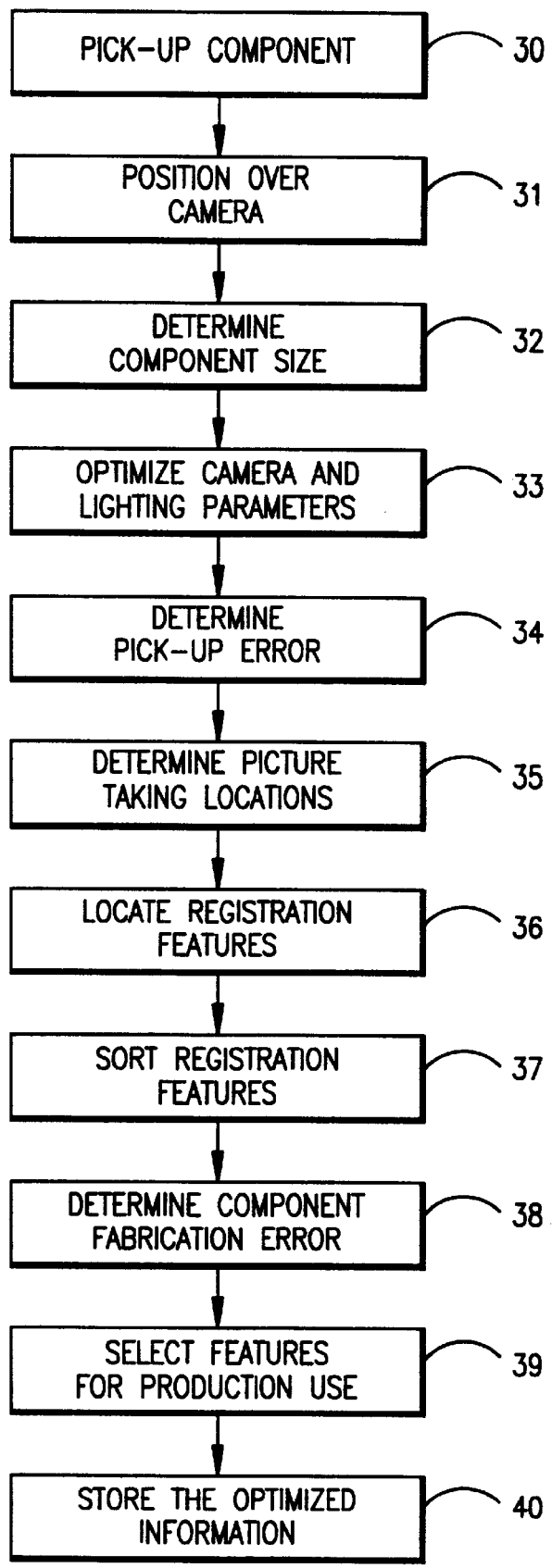
FIG. 2 is a first high level flowchart illustrating the process for mapping component features into a database for use during a component placement operation.

The preferred embodiment of the present invention, represented by the flowchart of FIG. 2, provides for component mapping in accordance with the execution sequence of FIG. 2. The component is picked up by the vacuum quill 12 in step 30. The component is then positioned in step 31 over the camera 18 aperture for viewing by the vision system. A series of execution steps, to be described more completely with respect to FIGS. 3 and 4, determines the component height, width and thickness. This dimensional information is stored in the database for use during the component placement.

With the dimensional information for the component now available, the software execution now determines a pickup error for the vacuum quill 12. Based on the length and width of the component, the centroid is located and its position is stored in step 34 in the database 24. Thus, during subsequent pick and place operations, the centroid location is available to accurately locate vacuum quill 12 with respect to the component centroid.

Figure 6:
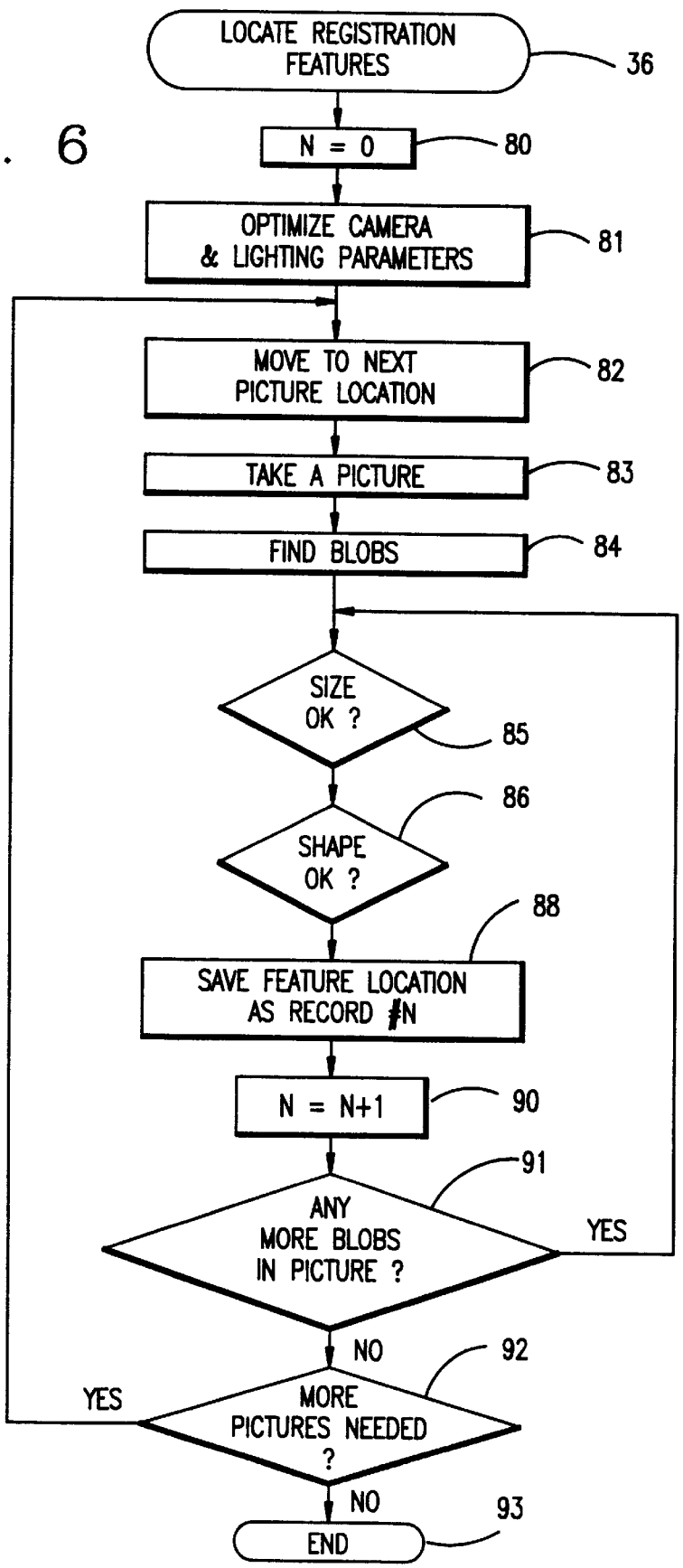
FIG. 6 is a flow chart of the execution sequence for locating registration features of the component.
Figure 7:
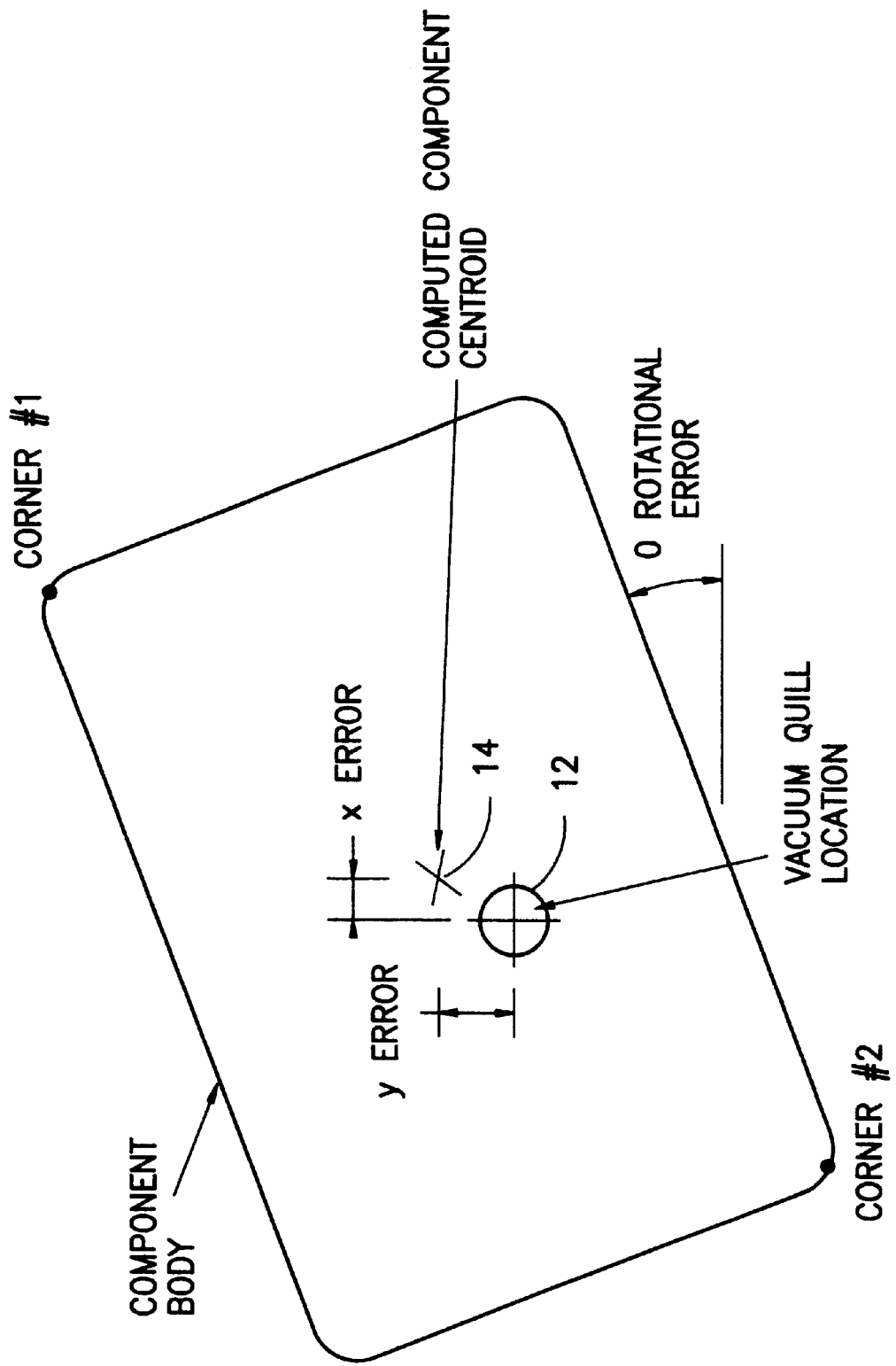
FIG. 7 shows the orientation and centroid error determined for a component being observed by the vision system.

FIG. 7 illustrates the image obtained from the camera when the component is initially selected. As can be seen from the Figure, the vacuum quill 12 location is different from an actual component centroid 14. The work cell controller sends a command set to the robot manipulator 11 to reduce the pickup error, represented by a rotational error as well as an offset error in the X and/or Y dimensions, so that the vision system is capable of locating various features of the component which are necessary for placement of the component. As will be evident from the description of FIGS. 6 and 8, extraction of these features is necessary to properly orient the component with respect to its mounting location.

In certain instances the component 15 is larger than the camera field of view. In this circumstance, multiple pictures of the component are necessary to capture the features of the entire component. The individual images are taken of the component 15 in a plurality of positions of the component 15 in step 35, and then stored in the image buffer of image processor 26 for subsequent analysis. The positioning of the component must be accurate to avoid overlap or exclusion of some component portion. As set forth in FIG. 8, multiple pictures are taken by moving the component from left to right, and thence vertically to obtain four different pictures which represent the entire surface area of component 15.

The registration features of the component are located by routine 36, to be described more particularly with reference to FIG. 6, which locates the features of the component which are needed to correctly orient the component with respect to its placement. In the instance of a component that uses solder bumps as input/output connections, a system capability for locating the bumps, identifying their size and location, is provided by the Adept Vision software. The vision machine 19 under control of an application running in the image processor 26 analyzes connected pixels having a grey scale level above a programmed threshold to identify solder bumps.

Figure 9:
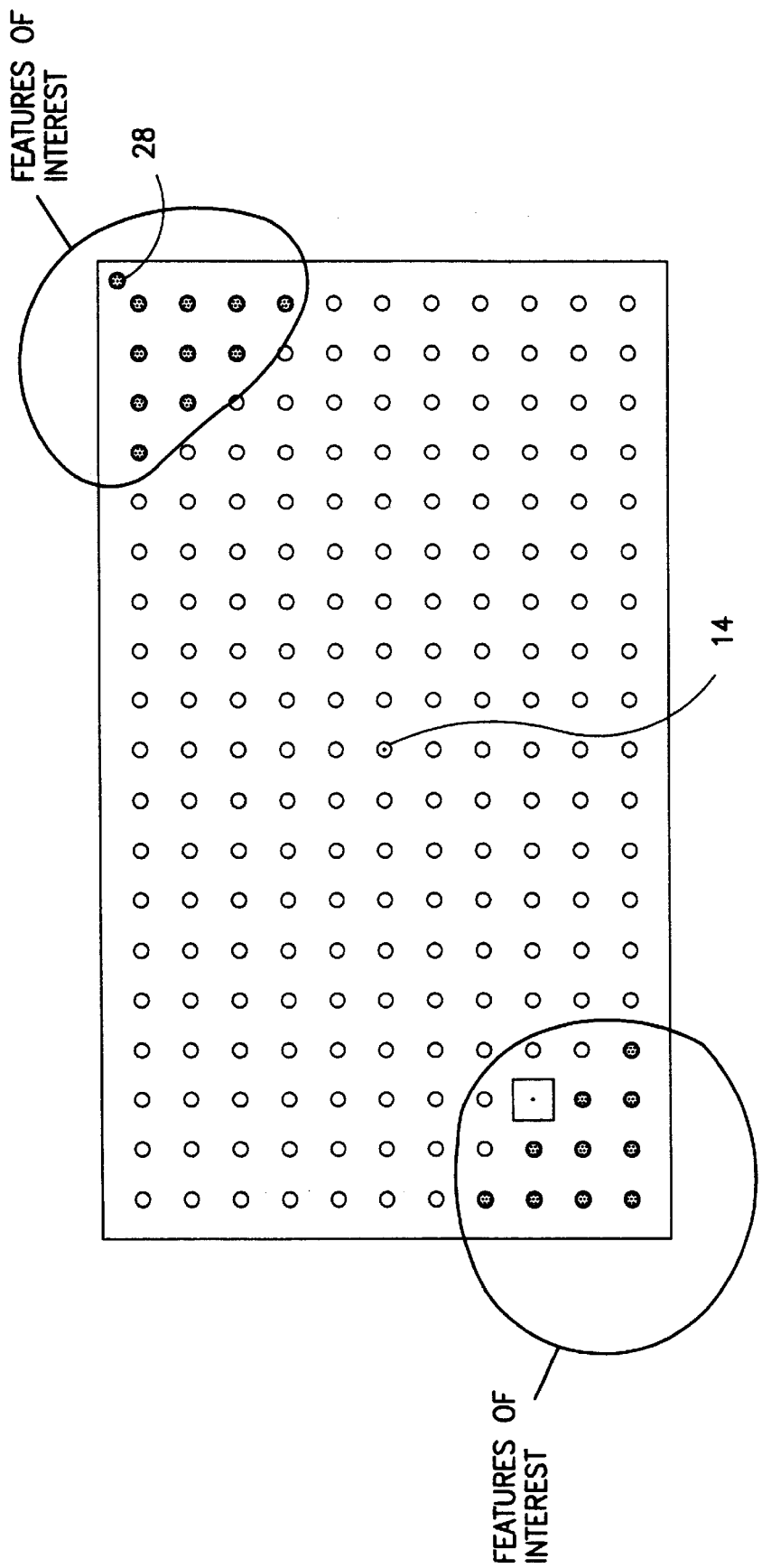
FIG. 9 illustrates the orientation features of a component which are selected for registration in the database of FIG. 1.

The located features are then sorted in accordance with the invention in routine 37. FIG. 9 illustrates the features contained in an image of the solder bumps of a component 15. As multiple images may be involved when the entire component has a length which exceeds the length of the field of view, duplicate features may be produced when two images are overlapped. Since two solder bumps cannot exist with overlapping diameters, one is discarded by routine 37.

In the case of a variety of solder bumps, the resolution of the vision system is such that no two bumps are found to have the same exact X or Y coordinate. The routine then determines if the bumps lie in the same row or column if their X or Y coordinate value is within a minimum range, such as 0.2025 mm in the case of flip chips. The respective values of the X and Y coordinates are then made equal to an average value representing a particular row or column.

Solder bump features which have a mirror image counterpart are flagged for subsequent processing. A mirror image solder blob is, with respect to a common axis, a symmetrical mirror image duplicate of another solder blob. In a FIG. 9, all of the solder blobs, except for number 28, has a mirror image counterpart with respect to the centroid of the component.

Routine 38 identifies the component fabrication error. During manufacture of the component, mechanical tolerances occur from component to component such that the registration a feature, which in the example of FIG. 9, is the solder bump array, is not perfectly centered with respect to the edges of the device. In order to place the component accurately on the substrate or circuit board the error may be determined by summing all of the X, Y coordinates of the mirror image features. If the component centroid is coincident with the center of the blob array the sum is zero. In the event they are not coincident, an offset value is obtained which can then be applied to all feature coordinates such that the center of the array becomes the centroid for the component. The value of the determined offset is also stored in the component database for use during component placement During pick and place procedures for locating components on substrates and/or circuit boards, various registration features of the component are necessary in order to correctly orient the component viz-a-viz its desired location on the substrate or circuit board. The number of features used for identifying the placement of the component impacts on pick and place throughput, and it is therefore necessary to limit the number of features selected to a number which assures placement accuracy without seriously impacting throughput.

The orientation features that do not have a mirror image counterpart are the most appropriate indicia of component orientation. Many component types are manufactured with a missing or extra solder bump, or other surface condition which is asymmetrical with respect to other features of the component, or a small depression in the component surface.

The user initially considers placement accuracy with respect to throughput necessity to derive the combination of features which are to be mapped.

In a typical scenario in which the missing or extra solder bump becomes the registration indicia, its location is stored in the database as an orientation feature. During placement, the stored orientation feature is used by software to instruct the robotic manipulator 11 to appropriately orient the component 15.

The size, shape and location of the features which were selected for component orientation are stored in the database in step 40. Further, the camera and lighting settings which were used to obtain these data in step 33 are also stored so that these conditions may be duplicated during a pick and place operation.

Figure 3:
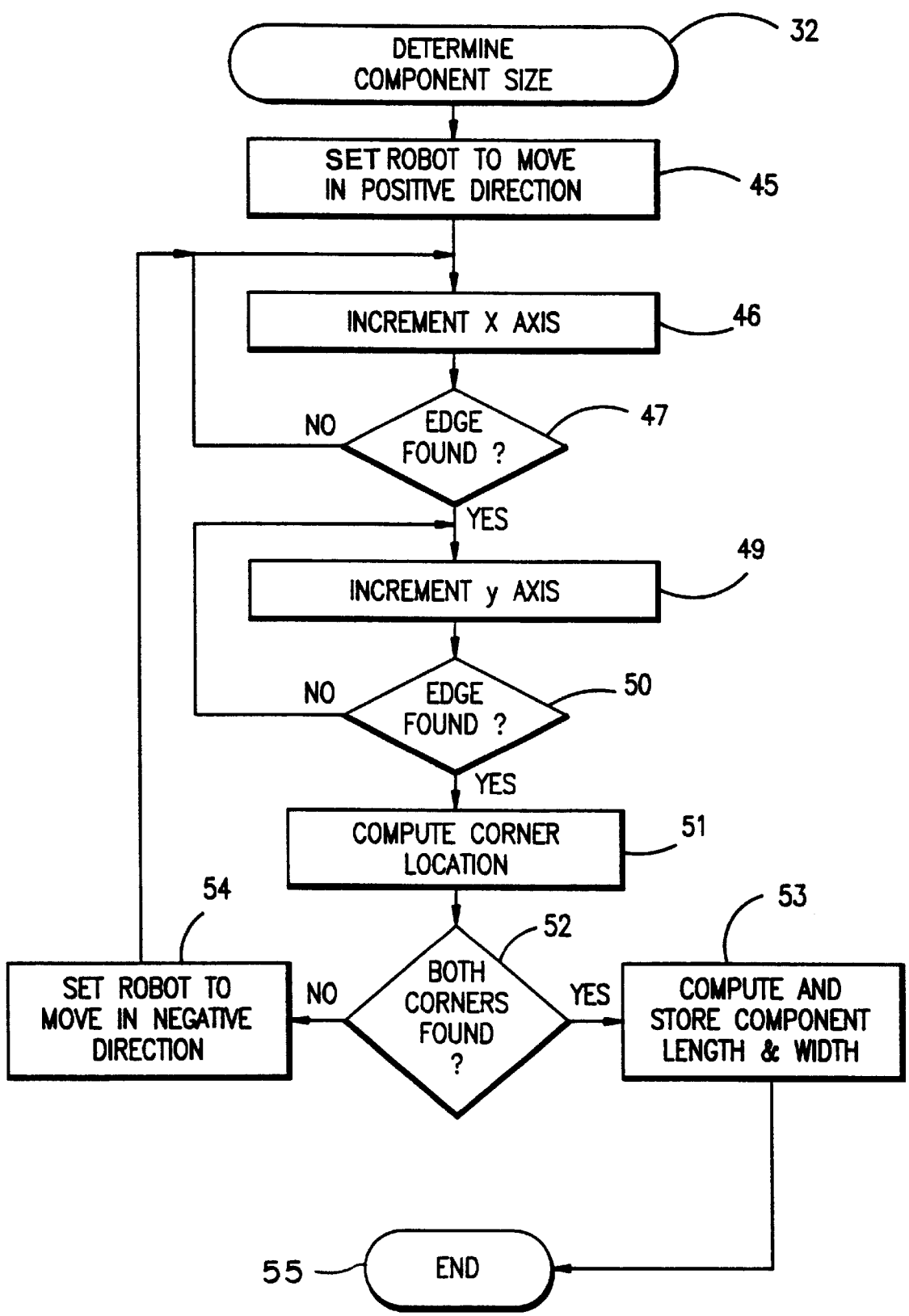
FIG. 3 is a flow chart illustrating the execution sequence for determining the component dimensions in one plane being viewed by the vision system of FIG. 1.

A detailed flow chart of the steps executed by the software in accordance with step 32 of the preferred embodiment of the invention is shown in FIG. 3. The work cell controller 22 provides a set of position indexing commands in step 45, to robotic manipulator 11 to move the component 15 supported by vacuum quill 12 along the X axis. Each increment of displacement in the X direction executed in step 46 results in a check by the vision system for an edge in decision block 47. The vision system determines, based on a change in a binary value of grey scale, from white to black, whether or not an edge is present. Further increments of position change are made until such time as decision block 47 detects the presence of an edge in the image derived by camera 18.

Once the edge has been located, the robot manipulator advances the vacuum quill 12 and gripped component along the Y axis. Increments of displacement are sequentially executed in step 49 until the edge along the axis perpendicular to the direction of movement is determined in decision block 50 as being within the field of view of camera 18.

Once each of the edges are found along the X, Y axes, a corner location is computed in step 51. Following location of one corner, the process is repeated by moving the quill 12 in a negative (opposite) direction in step 54 to locate the remaining two edges providing diagonal corners of the device, and the positions of the corners is stored along with a computed width and length for the component in step 53 in database 24. Having located the edges, corners and length and width of the component, the routine exits at step 55.

Figure 4:
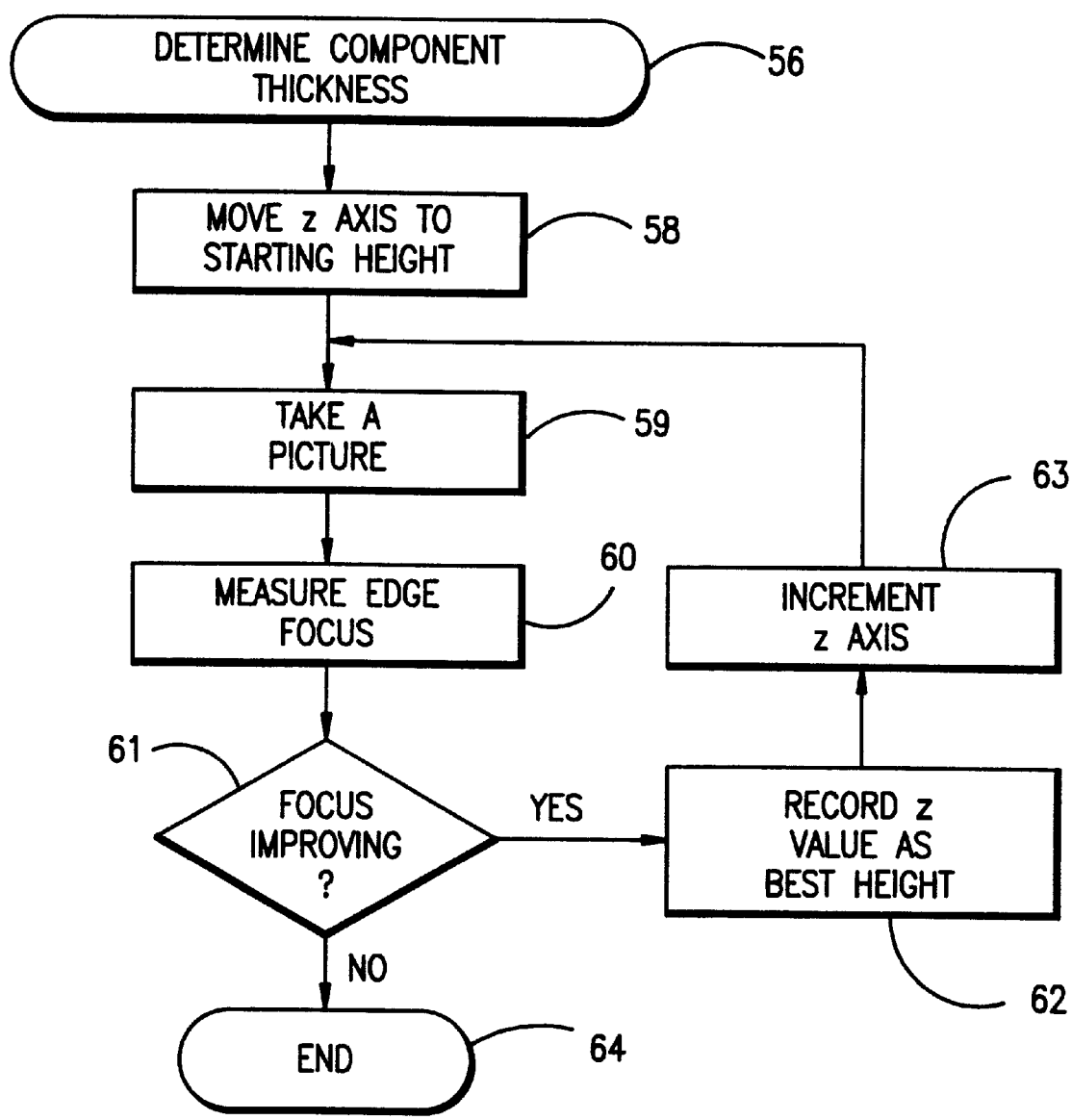
FIG. 4 is a flow chart of the execution steps for determining the thickness of a component being observed by the vision system of FIG. 1.

The remaining dimension to be determined is the thickness of the component. FIG. 4 shows a routine for a machine vision system 19 and robot manipulator 11 of FIG. 1 to execute in order to determine the thickness of the component 15.

Location of the component thickness 56 begins by moving the robot manipulator vacuum quill 12 along the Z axis to a known starting position in step 58. At different increments of displacement along the Z axis an image frame is captured by the image processor 26 and stored in step 59. The position of an empty vacuum quill is known from an initial work cell controller 22 calibration. During each incremental move of the component 15 along the Z axis, the edge focus is measured in step 60 by the application program of work cell controller 22. Decision block 61 determines when a best focus condition has been obtained. The position along the Z axis is continuously incremented in step 63, until such time as the best focus has been obtained. The position location along the Z axis of the quill 22 providing the best focus is stored in step 62. The difference between the starting position height stored in step 58, i.e., the height at which the empty quill is at optimum focus, and the best focus position along the Z axis is stored as the component thickness in the database 24. Thus, the component database 24 includes the location of the centroid, the width, length and thickness of the component.

Figure 5:
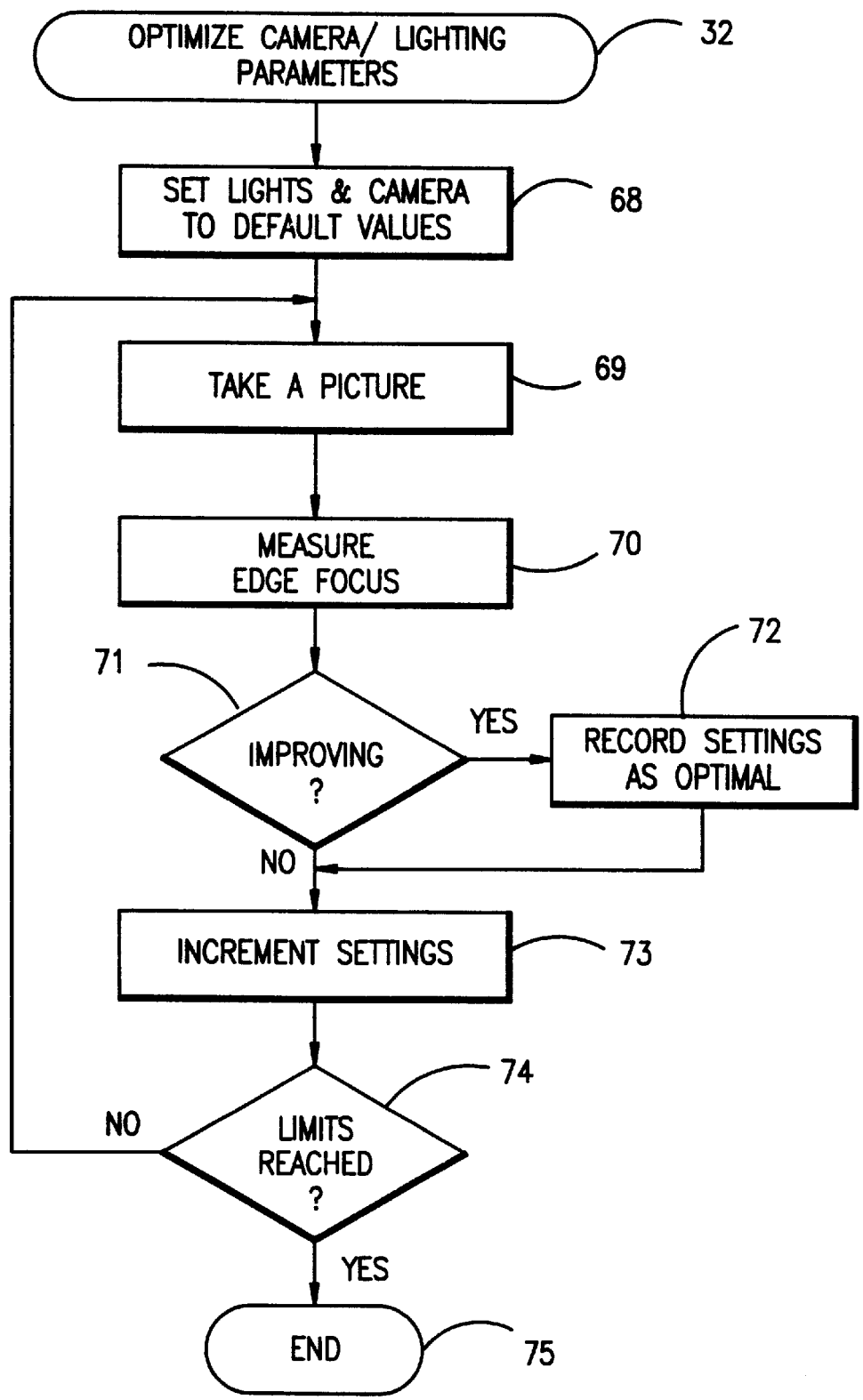
FIG. 5 is an execution sequence for optimizing the parameters of the vision system.

The routine 33 for calibrating the systems of FIG. 2 is shown more particularly in FIG. 5. The camera in the existing pick and place equipment has various parameter settings, including the amount of light emitted by lights 20, 21, as well as the gain setting and offset setting for the camera. As these parameters influence the measurement ability of the system, it is necessary to record their values when the dimensional information is being obtained from the components, so that during placement of the components, the settings are set to the same levels as were obtained during the process of obtaining dimensional information.

An image frame is captured in step 69, and the edge focus is determined in step 70. As the parameter values are incremented, a determination is made in step 73 as to whether the edge focus is improving or not. As the edge focus continues to improve, the increment settings 73 are incremented for each parameter in the same direction until an optimal setting is obtained. Once the optimal setting is obtained for the parameter its value is stored in step 72 in the database 24.

In the event that a limit is reached as determined in decision block 74 without having reached an improved setting, the process is ended in step 75.

Thus, the settings which were used to obtain component information are available for use when placing the component, thus ensuring measurement accuracy during both processes.

The routine 36 for locating registration features is shown more particularly in FIG. 6. The routine takes advantage of the preexisting capability of the vision machine to determine which features on the component are to be identified and stored in the database. The previously identified features are obtained by the vision machine after first optimizing the camera parameters in step 81 for the features. This process is similar to that of FIG. 5, wherein the optimization is for the specific registration features, such as solder bumps. The solder bumps provide a different focus than the edge focus. The improved focus enhances the ability to locate and evaluate the various solder bumps on the component.

The process of registering the features such as solder bumps begins with a series of images being taken in step 82.

Figure 8:
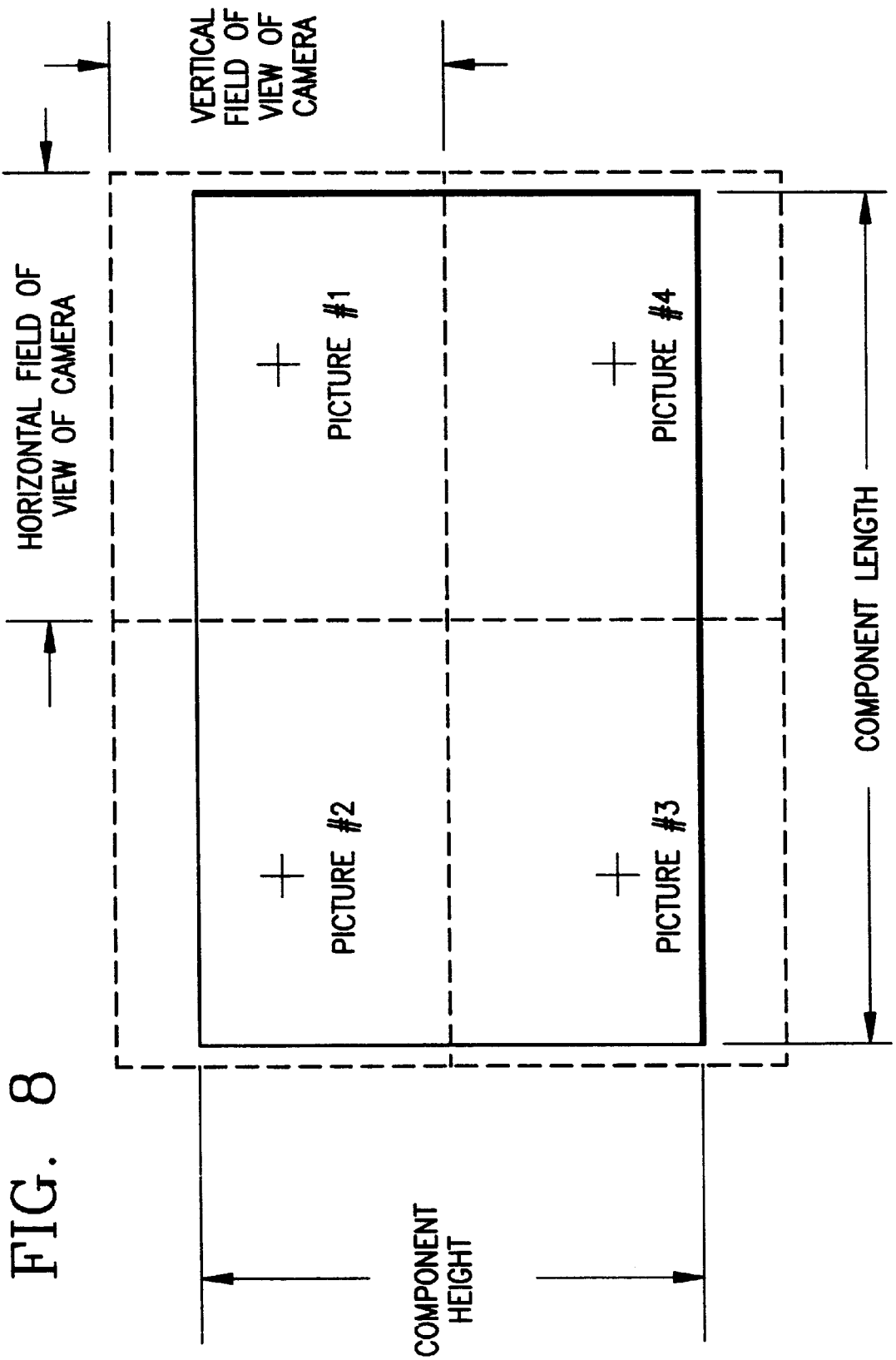
FIG. 8 illustrates the multiple pictures necessary to observe the full length of a component.

As was demonstrated with respect to FIG. 8, the camera field of view may not take in the entire bump array, and multiple images of the bump array are necessary to find the features of interest.

The first image frame of the sequence of image frames is taken in step 83 and stored in the buffer of image processor 26. The software in the image processor 26 contains logic for identifying the blob sizes and relative spacings between blobs of an image. If the image analyzed by the image processor 26 locates pixels representing a blob in step 84, the size and shape are checked in steps 85 and 86. The location of the blob is stored as a record for the index number set in step 80. The index number is then incremented in step 90, and the remaining blobs in a picture are located in step 91.

If additional pictures are needed to view the entire bump array, decision block 92 results in the additional image frames being obtained for analyzing the complete array of solder blobs.

Thus, a data is stored in a database 24 for the component representing the overall dimensions of the component 15 as well as the configuration of solder bump array.

Having now obtained all the component features, including solder bumps which may be present in an array, the features may be sorted in step 37 of FIG. 2 to find those which represent orientation criteria for the component. The sorting procedure may in the case of the component shown in FIG. 9 locate the locations of bump 28 as the registration feature. The locations of this feature may be stored in the component database.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description-is not intended to limit the invention to the form disclosed herein. Also, it is intended that the appended claims be construed to include alternative embodiments.

What is claimed is:

1. A method for determining component dimensional information for placing a component on a circuit board comprising:

grasping a component at substantially the centroid of said component with a positioning tool;

positioning said component over the aperture of a camera;

detecting first and second edges of said component in the field of view of said camera;

detecting third and fourth edges of said component;

determining from said detected edges at least one dimension of said component;

storing said dimension in a component database for use in placement of said component on a circuit board, determining a component pickup error by comparing a position of said centroid with the location of a position of a grasping tool which supports said component, and storing said component pickup error in said component database;

wherein said step for locating said second and third edges comprising:

indexing the position of said component a plurality of positions until said second and third edges are positioned in said camera aperture; and determining a first dimension of said component from said plurality of positions and the location of one of said edges in a field of view of said camera.

2. The method for determining component dimensional information according to claim 1 further comprising:

determining from said dimension(s) a location of a centroid of said component and storing said centroid location in said component database.

3. The method for determining component dimensional information according to claim 1 further comprising:

determining the presence of an array of solder connections on said component centered at said centroid;

determining whether or not each of said solder connections has a mirror image solder connection in said array;

identifying each solder connection not having a mirror image solder connection; and storing the location of said solder connection not having a mirror image solder connection as a position identifying orientation feature of said component in said component database.

4. The method for determining component dimensional information according to claim 3, further comprising:

locating with said camera solder connections which are furthest from said centroid; and storing position data for said solder locations in said component database.

5. A system for determining component dimensional information comprising:

a component grasping tool positionable in at least first and second directions;

a camera having an aperture which is parallel to a plane defined by said first and second directions, said camera generating a plurality of pixels representing an image of a surface of said component;

a vision machine comprising a work cell controller connected to said component grasping tool for positioning said component grasping tool in said first and second directions, and connected to said camera, and an image processor and a component database, said work cell controller being programmed to execute the following steps:

incrementally positioning said component being grasped by said component grasping tool over an aperture of said camera;

processing said plurality of pixels with said image processor to locate first and second edges of said component;

indexing the position of said component grasping tool until third and fourth edges of said component are visible in said camera aperture;

based on the change of position of said grasping tool and the position of pixels which detect said third and fourth edges, determining the location of first and second diagonal corners of said component and a centroid of said component; and storing the location of said centroid in said component database.

6. The system according to claim 5 wherein said work cell controller is further programmed to calculate and offset between a position of said grasping tool with respect to said centroid, and to store said offset in said database.

7. The system according to claim 5 wherein said work cell controller is programmed to compute the length and width of said component from said positions of said edges, and to store said length and width in said database.

8. The system according to claim 5 wherein said work cell controler further executes the steps of:

identifying from said pixels an array of solder connections on said component;

identifying from said pixels solder connections which do not have a mirror image counterpart in said array; and storing the location of said solder connections which do not have said counterpart in said database.

9. The system according to claim 8 wherein said work cell controller is programmed to execute the steps defining a grid which locates rows and columns of said solder connection said grid having coordinates which are within a predetermined range of the actual location of said solder connections.

* * * * *